(12) United States Patent
Schneider

(10) Patent No.: US 11,536,788 B2
(45) Date of Patent: Dec. 27, 2022

(54) METHOD AND DEVICE FOR ACTIVE SUPPRESSION OF ELECTRIC AND/OR MAGNETIC FIELDS EMITTED DURING MAGNETIC RESONANCE ACQUISITIONS

(71) Applicant: Siemens Healthcare GmbH, Erlangen (DE)

(72) Inventor: Rainer Schneider, Erlangen (DE)

(73) Assignee: Siemens Healthcare GmbH, Erlangen (DE)

( * ) Notice: Subject to any disclaimer, the term of this patent is extended or adjusted under 35 U.S.C. 154(b) by 0 days.

(21) Appl. No.: 17/462,138

(22) Filed: Aug. 31, 2021

(65) Prior Publication Data

US 2022/0082644 A1    Mar. 17, 2022

(30) Foreign Application Priority Data

Sep. 11, 2020    (DE) .................... 10 2020 211 439.0

(51) Int. Cl.
*G01R 33/421*    (2006.01)
(52) U.S. Cl.
CPC .................. *G01R 33/421* (2013.01)
(58) Field of Classification Search
CPC ............................ G01R 33/421; G01R 33/422
See application file for complete search history.

(56) References Cited

U.S. PATENT DOCUMENTS

| 4,646,046 | A | * | 2/1987 | Vavrek | G12B 17/02 335/211 |
| 5,128,643 | A | * | 7/1992 | Newman | G01R 33/421 335/304 |
| 2002/0195977 | A1 | * | 12/2002 | Goto | G01R 33/389 315/368.28 |
| 2020/0249292 | A1 | | 8/2020 | Biber et al. | |

FOREIGN PATENT DOCUMENTS

| JP | 02159595 A | * | 6/1990 | |
| JP | 2002143126 A | * | 5/2002 | ........... G06F 3/0235 |

OTHER PUBLICATIONS

D. W. Harberts and M. van Helvoort, "Shielding requirements of a 3T MRI examination room to limit radiated emission," 2013 International Symposium on Electromagnetic Compatibility, 2013, pp. 1053-1057 (Year: 2013).*
German Office Action and English translation thereof dated Jul. 19, 2021.
German Decision to Grant and English translation thereof dated Feb. 2, 2022.
German Office Action dated Jul. 19, 2021.

* cited by examiner

*Primary Examiner* — Daniel R Miller
(74) *Attorney, Agent, or Firm* — Harness, Dickey & Pierce P.L.C.

(57) ABSTRACT

A computer-implemented method is provided for at least partially suppressing an electromagnetic field emitted by a magnetic resonance device during an examination. The method includes measuring a signature of the emitted elec- (Continued)

tromagnetic field using a sensor facility; providing a reference field profile, the reference field profile characterizing an electromagnetic reference field produced by the magnetic resonance device; adapting the reference field profile to the measured signature; and suppressing the emitted electromagnetic field based upon the adapted reference field profile.

23 Claims, 5 Drawing Sheets

METHOD AND DEVICE FOR ACTIVE SUPPRESSION OF ELECTRIC AND/OR MAGNETIC FIELDS EMITTED DURING MAGNETIC RESONANCE ACQUISITIONS

PRIORITY STATEMENT

The present application hereby claims priority under 35 U.S.C. § 119 to German patent application number DE102020211439.0 filed Sep. 11, 2020, the entire contents of which are hereby incorporated herein by reference.

FIELD

Example embodiments of the invention generally relate to a method for active suppression of electric and/or magnetic emissions from a magnetic resonance device, and to a magnetic resonance device having a corresponding suppression apparatus.

BACKGROUND

Magnetic resonance devices (also known as magnetic resonance systems) are imaging apparatuses which, in order to image an object under examination, align nuclear spins of the object under examination with a strong external magnetic field, and use an alternating magnetic field to excite the nuclear spins to precess about this alignment. The precession or return of the spins from this excited state into a low-energy state in turn produces as a response an alternating magnetic field, which is received via antennas.

Gradient magnetic fields are used to apply spatial encoding to the signals, so that the received signal can subsequently be associated with a volume element. The received signal is then analyzed, and a three-dimensional imaging representation of the object under examination is provided. Local receive antennas, known as local coils, which are arranged directly on the object under examination in order to achieve a better signal-to-noise ratio, are preferably used to receive the signal. The receive antennas can also be arranged in a patient couch.

Magnetic resonance devices require radiofrequency shielding on two counts. On the one hand, the magnetic resonance signals to be received for the imaging are extremely weak. Shielding against external interference signals is needed in this case to achieve a sufficient signal-to-noise ratio (SNR). On the other hand, radiofrequency pulses at powers in the kilowatt range are produced in order to excite the nuclear spins, and are only partially absorbed in the object under examination. Radio waves are radiated into space and must therefore be shielded in order to comply with emission limits. Therefore magnetic resonance devices are typically arranged in a room shielded against radiofrequency pulses.

SUMMARY

The inventors have discovered that a shielded room of such a type not only involves high costs but significantly limits the flexibility in installing magnetic resonance devices.

At least one embodiment of the present invention defines a method and/or an apparatus that facilitate simpler shielding of the electric and/or magnetic field emitted by a magnetic resonance device.

Embodiments of the invention are directed to a method for at least partially suppressing an electric and/or magnetic field emitted by a magnetic resonance device during an examination; a corresponding magnetic resonance device; a computer program product; and a computer-readable storage medium. The claims define advantageous developments.

Embodiments of the invention are described below with reference to the claimed methods and with reference to the claimed apparatuses. Features, advantages or alternative embodiments mentioned in this connection can also be applied equally to the other subject matter, and vice versa. In other words, the embodiments and claims (which claims are directed at a magnetic resonance device, for example) can also be developed by combining with features of embodiments described or claimed in connection with a method. The corresponding functional features of the method are embodied by corresponding modules in this case.

According to an embodiment of the invention, a computer-implemented method is provided for at least partially suppressing an electric and/or magnetic field emitted by a magnetic resonance device during an examination. The method comprises a plurality of steps. A first step aims to measure a signature of the emitted electric and/or magnetic field using a sensor facility. A further step aims to provide a reference field profile, which reference field profile describes an electric and/or magnetic reference field for the magnetic resonance device. A further step aims to adapt the reference field profile to the measured signature. In addition, a step aims to suppress the emitted electric and/or magnetic field based upon the adapted reference field profile.

According to a further embodiment of the present invention, a magnetic resonance device having a suppression apparatus is provided, which suppression apparatus is designed to at least partially suppress an electric and/or magnetic field emitted by the magnetic resonance device during an examination. The suppression apparatus has a computing facility, and also has a sensor facility and a transmit facility, which are each in signal communication with the computing facility. The sensor facility is designed to measure a signature of the electric and/or magnetic field emitted by the magnetic resonance device, while the transmit facility is designed to produce an electric and/or magnetic opposing field for the purpose of at least partially compensating the emitted electric and/or magnetic field. The computing facility is designed to provide a reference field profile, which reference field profile describes an electric and/or magnetic reference field for the magnetic resonance device. The computing facility is also designed to adapt the reference field profile to the measured signature. The computing facility is moreover designed to control the transmit facility in such a way that the opposing field produced by the transmit facility compensates at least partially the adapted reference field profile.

According to an embodiment, the suppression apparatus also has a memory facility, which is in signal communication with the computing facility, in which memory facility are stored a plurality of selection reference field profiles. The computing facility is also designed to provide the reference field profile by selecting from the selection reference field profiles based upon the signature and/or a piece of examination information relating to the examination.

The memory facility can be in the form of a central or local database. In particular, the memory facility can be part of the magnetic resonance device and/or of the suppression apparatus. For example, the memory facility can be in the form of a computer-readable data storage medium of the magnetic resonance device and/or of the suppression apparatus. In particular, the memory facility can be in the form of an SSD or HDD hard disk, which the computing facility can access. Alternatively, the memory facility may be part of a local server architecture or of a Cloud storage system.

In a further embodiment, the invention relates to a computer program product, which comprises a program and can be loaded directly into a memory of the programmable computing facility, and has program segments, e.g. libraries and auxiliary functions, in order to perform a method, in particular according to an embodiment, for at least partially suppressing an electric and/or magnetic field emitted by a magnetic resonance device during an examination, when the one computer program product is executed.

In a further embodiment, the invention relates to a computer-implemented method for at least partially suppressing at least one of an emitted electric field and emitted magnetic field, emitted by a magnetic resonance device during an examination, the computer-implemented method comprising:

measuring a signature of at least one of the emitted electric field and emitted magnetic field using a sensor facility;

providing a reference field profile, the reference field profile describing at least one of an electric reference field and a magnetic reference field for the magnetic resonance device;

adapting the reference field profile to the signature measured, to produce an adapted reference field profile; and suppressing the at least one of the emitted electric field and emitted magnetic field based upon the adapted reference field profile.

In a further embodiment, the invention relates to a magnetic resonance device, comprising:

a suppression apparatus, designed to at least partially suppress at least one of an electric field and a magnetic field emitted by a magnetic resonance device during an examination, the suppression apparatus including
   a computing facility,
   a sensor facility and
   a transmit facility, each of the sensor facility and the transmit facility being in signal communication with the computing facility,
   the sensor facility being designed to measure a signature of at least one of the electric field emitted and the magnetic field emitted by the magnetic resonance device,
   the transmit facility being designed to produce at least one of an electric opposing field and a magnetic opposing field,
   the computing facility being designed to:
     provide a reference field profile, the reference field profile describing at least one of an electric reference field and a magnetic reference field for the magnetic resonance device;
     adapt the reference field profile to the signature measured, to produce an adapted reference field profile; and
     control the transmit facility to use the at least one of an electric opposing field and a magnetic opposing field emitted by the transmit facility to compensate, at least partially, the adapted reference field profile.

In a further embodiment, the invention relates to a non-transitory computer program product, storing a program directly loadable into a memory of a programmable computing facility, and the program including program segments to perform the method of an embodiment when the program is executed in the programmable computing facility.

In a further embodiment, the invention relates to a non-transitory computer-readable storage medium, storing program segments, readable and executable by a computing facility to perform the method of an embodiment when the program segments are executed by the computing facility.

BRIEF DESCRIPTION OF THE DRAWINGS

Further features and advantages of the invention are disclosed in the following explanations of example embodiments with reference to schematic drawings. Modifications mentioned in this connection can be combined with one another to form new embodiments. The same reference signs are used for the same features in different figures, in which.

DETAILED DESCRIPTION OF THE EXAMPLE EMBODIMENTS

Figure 1:
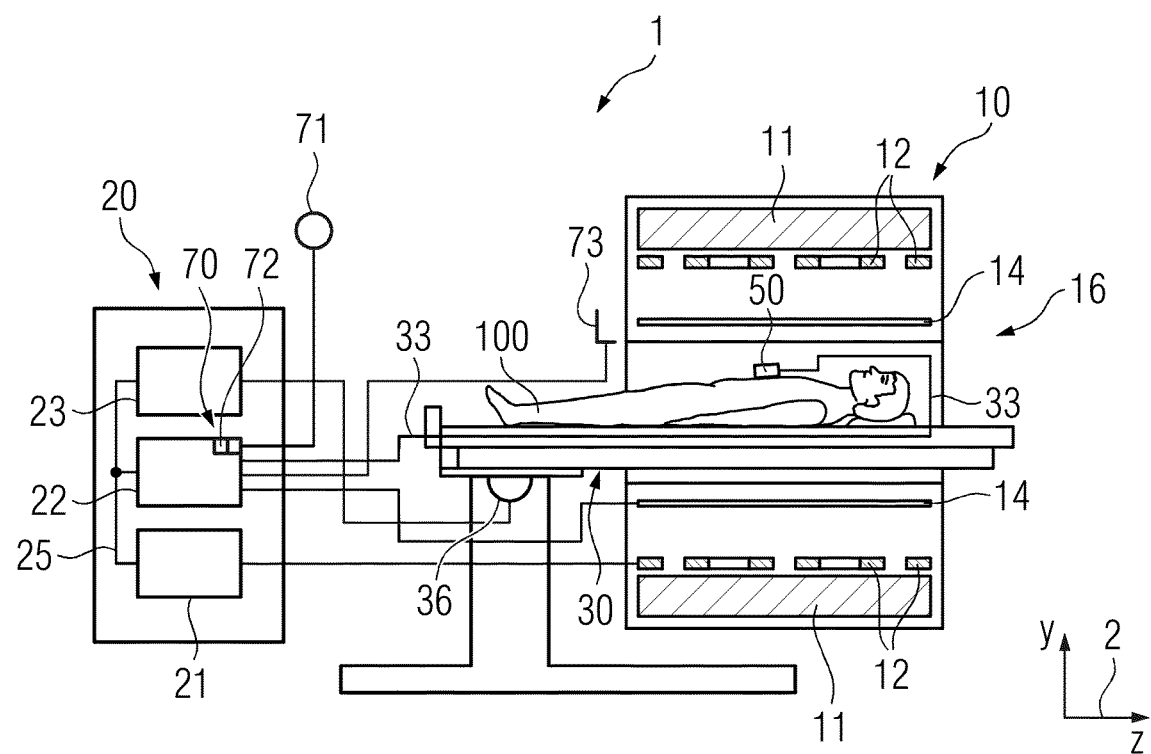
FIG. 1 is a schematic diagram of a magnetic resonance device having a suppression apparatus according to the invention according to an embodiment.

The drawings are to be regarded as being schematic representations and elements illustrated in the drawings are not necessarily shown to scale. Rather, the various elements are represented such that their function and general purpose become apparent to a person skilled in the art. Any connection or coupling between functional blocks, devices, components, or other physical or functional units shown in the drawings or described herein may also be implemented by an indirect connection or coupling. A coupling between components may also be established over a wireless connection. Functional blocks may be implemented in hardware, firmware, software, or a combination thereof.

Various example embodiments will now be described more fully with reference to the accompanying drawings in which only some example embodiments are shown. Specific structural and functional details disclosed herein are merely representative for purposes of describing example embodiments. Example embodiments, however, may be embodied in various different forms, and should not be construed as being limited to only the illustrated embodiments. Rather, the illustrated embodiments are provided as examples so that this disclosure will be thorough and complete, and will fully convey the concepts of this disclosure to those skilled in the art. Accordingly, known processes, elements, and techniques, may not be described with respect to some example embodiments. Unless otherwise noted, like reference characters denote like elements throughout the attached drawings and written description, and thus descriptions will not be repeated. At least one embodiment of the present invention, however, may be embodied in many alternate forms and should not be construed as limited to only the example embodiments set forth herein.

It will be understood that, although the terms first, second, etc. may be used herein to describe various elements, components, regions, layers, and/or sections, these elements, components, regions, layers, and/or sections, should not be limited by these terms. These terms are only used to distinguish one element from another. For example, a first element could be termed a second element, and, similarly, a second element could be termed a first element, without departing from the scope of example embodiments of the present invention. As used herein, the term "and/or," includes any and all combinations of one or more of the associated listed items. The phrase "at least one of" has the same meaning as "and/or".

Spatially relative terms, such as "beneath," "below," "lower," "under," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below," "beneath," or "under," other elements or features would then be oriented "above" the other elements or features. Thus, the example terms "below" and "under" may encompass both an orientation of above and below. The device may be otherwise oriented (rotated 90 degrees or at other orientations) and the spatially relative descriptors used herein interpreted accordingly. In addition, when an element is referred to as being "between" two elements, the element may be the only element between the two elements, or one or more other intervening elements may be present.

Spatial and functional relationships between elements (for example, between modules) are described using various terms, including "connected," "engaged," "interfaced," and "coupled." Unless explicitly described as being "direct," when a relationship between first and second elements is described in the above disclosure, that relationship encompasses a direct relationship where no other intervening elements are present between the first and second elements, and also an indirect relationship where one or more intervening elements are present (either spatially or functionally) between the first and second elements. In contrast, when an element is referred to as being "directly" connected, engaged, interfaced, or coupled to another element, there are no intervening elements present. Other words used to describe the relationship between elements should be interpreted in a like fashion (e.g., "between," versus "directly between," "adjacent," versus "directly adjacent," etc.).

The terminology used herein is for the purpose of describing particular embodiments only and is not intended to be limiting of example embodiments of the invention. As used herein, the singular forms "a," "an," and "the," are intended to include the plural forms as well, unless the context clearly indicates otherwise. As used herein, the terms "and/or" and "at least one of" include any and all combinations of one or more of the associated listed items. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Also, the term "example" is intended to refer to an example or illustration.

When an element is referred to as being "on," "connected to," "coupled to," or "adjacent to," another element, the element may be directly on, connected to, coupled to, or adjacent to, the other element, or one or more other intervening elements may be present. In contrast, when an element is referred to as being "directly on," "directly connected to," "directly coupled to," or "immediately adjacent to," another element there are no intervening elements present.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

Before discussing example embodiments in more detail, it is noted that some example embodiments may be described with reference to acts and symbolic representations of operations (e.g., in the form of flow charts, flow diagrams, data flow diagrams, structure diagrams, block diagrams, etc.) that may be implemented in conjunction with units and/or devices discussed in more detail below. Although discussed in a particularly manner, a function or operation specified in a specific block may be performed differently from the flow specified in a flowchart, flow diagram, etc. For example, functions or operations illustrated as being performed serially in two consecutive blocks may actually be performed simultaneously, or in some cases be performed in reverse order. Although the flowcharts describe the operations as sequential processes, many of the operations may be performed in parallel, concurrently or simultaneously. In addition, the order of operations may be re-arranged. The processes may be terminated when their operations are completed, but may also have additional steps not included in the figure. The processes may correspond to methods, functions, procedures, subroutines, subprograms, etc.

Specific structural and functional details disclosed herein are merely representative for purposes of describing example embodiments of the present invention. This invention may, however, be embodied in many alternate forms and should not be construed as limited to only the embodiments set forth herein.

Units and/or devices according to one or more example embodiments may be implemented using hardware, software, and/or a combination thereof. For example, hardware devices may be implemented using processing circuitry such as, but not limited to, a processor, Central Processing Unit (CPU), a controller, an arithmetic logic unit (ALU), a digital signal processor, a microcomputer, a field programmable gate array (FPGA), a System-on-Chip (SoC), a programmable logic unit, a microprocessor, or any other device capable of responding to and executing instructions in a defined manner. Portions of the example embodiments and corresponding detailed description may be presented in terms of software, or algorithms and symbolic representations of operation on data bits within a computer memory.

These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" of "displaying" or the like, refer to the action and processes of a computer system, or similar electronic computing device/hardware, that manipulates and transforms data represented as physical, electronic quantities within the computer system's registers and memories into other data similarly represented as physical quantities within the computer system memories or registers or other such information storage, transmission or display devices.

In this application, including the definitions below, the term 'module' or the term 'controller' may be replaced with the term 'circuit.' The term 'module' may refer to, be part of, or include processor hardware (shared, dedicated, or group) that executes code and memory hardware (shared, dedicated, or group) that stores code executed by the processor hardware.

The module may include one or more interface circuits. In some examples, the interface circuits may include wired or wireless interfaces that are connected to a local area network (LAN), the Internet, a wide area network (WAN), or combinations thereof. The functionality of any given module of the present disclosure may be distributed among multiple modules that are connected via interface circuits. For example, multiple modules may allow load balancing. In a further example, a server (also known as remote, or cloud) module may accomplish some functionality on behalf of a client module.

Software may include a computer program, program code, instructions, or some combination thereof, for independently or collectively instructing or configuring a hardware device to operate as desired. The computer program and/or program code may include program or computer-readable instructions, software components, software modules, data files, data structures, and/or the like, capable of being implemented by one or more hardware devices, such as one or more of the hardware devices mentioned above. Examples of program code include both machine code produced by a compiler and higher level program code that is executed using an interpreter.

For example, when a hardware device is a computer processing device (e.g., a processor, Central Processing Unit (CPU), a controller, an arithmetic logic unit (ALU), a digital signal processor, a microcomputer, a microprocessor, etc.), the computer processing device may be configured to carry out program code by performing arithmetical, logical, and input/output operations, according to the program code. Once the program code is loaded into a computer processing device, the computer processing device may be programmed to perform the program code, thereby transforming the computer processing device into a special purpose computer processing device. In a more specific example, when the program code is loaded into a processor, the processor becomes programmed to perform the program code and operations corresponding thereto, thereby transforming the processor into a special purpose processor.

Software and/or data may be embodied permanently or temporarily in any type of machine, component, physical or virtual equipment, or computer storage medium or device, capable of providing instructions or data to, or being interpreted by, a hardware device. The software also may be distributed over network coupled computer systems so that the software is stored and executed in a distributed fashion. In particular, for example, software and data may be stored by one or more computer readable recording mediums, including the tangible or non-transitory computer-readable storage media discussed herein.

Even further, any of the disclosed methods may be embodied in the form of a program or software. The program or software may be stored on a non-transitory computer readable medium and is adapted to perform any one of the aforementioned methods when run on a computer device (a device including a processor). Thus, the non-transitory, tangible computer readable medium, is adapted to store information and is adapted to interact with a data processing facility or computer device to execute the program of any of the above mentioned embodiments and/or to perform the method of any of the above mentioned embodiments.

Example embodiments may be described with reference to acts and symbolic representations of operations (e.g., in the form of flow charts, flow diagrams, data flow diagrams, structure diagrams, block diagrams, etc.) that may be implemented in conjunction with units and/or devices discussed in more detail below. Although discussed in a particularly manner, a function or operation specified in a specific block may be performed differently from the flow specified in a flowchart, flow diagram, etc. For example, functions or operations illustrated as being performed serially in two consecutive blocks may actually be performed simultaneously, or in some cases be performed in reverse order.

According to one or more example embodiments, computer processing devices may be described as including various functional units that perform various operations and/or functions to increase the clarity of the description. However, computer processing devices are not intended to be limited to these functional units. For example, in one or more example embodiments, the various operations and/or functions of the functional units may be performed by other ones of the functional units. Further, the computer processing devices may perform the operations and/or functions of the various functional units without sub-dividing the operations and/or functions of the computer processing units into these various functional units.

Units and/or devices according to one or more example embodiments may also include one or more storage devices. The one or more storage devices may be tangible or non-transitory computer-readable storage media, such as random access memory (RAM), read only memory (ROM), a permanent mass storage device (such as a disk drive), solid state (e.g., NAND flash) device, and/or any other like data storage mechanism capable of storing and recording data. The one or more storage devices may be configured to store computer programs, program code, instructions, or some combination thereof, for one or more operating systems and/or for implementing the example embodiments described herein. The computer programs, program code, instructions, or some combination thereof, may also be loaded from a separate computer readable storage medium into the one or more storage devices and/or one or more computer processing devices using a drive mechanism. Such separate computer readable storage medium may include a Universal Serial Bus (USB) flash drive, a memory stick, a Blu-ray/DVD/CD-ROM drive, a memory card, and/or other like computer readable storage media. The computer programs, program code, instructions, or some combination thereof, may be loaded into the one or more storage devices and/or the one or more computer processing devices from a remote data storage device via a network interface, rather than via a local computer readable storage medium. Additionally, the computer programs, program code, instructions, or some combination thereof, may be loaded into the one or more storage devices and/or the one or more processors from a remote computing system that is configured to transfer and/or distribute the computer programs, program code, instructions, or some combination thereof, over a network. The remote computing system may transfer and/or distribute the computer programs, program code, instructions, or some combination thereof, via a wired interface, an air interface, and/or any other like medium.

The one or more hardware devices, the one or more storage devices, and/or the computer programs, program code, instructions, or some combination thereof, may be specially designed and constructed for the purposes of the example embodiments, or they may be known devices that are altered and/or modified for the purposes of example embodiments.

A hardware device, such as a computer processing device, may run an operating system (OS) and one or more software applications that run on the OS. The computer processing device also may access, store, manipulate, process, and create data in response to execution of the software. For simplicity, one or more example embodiments may be exemplified as a computer processing device or processor; however, one skilled in the art will appreciate that a hardware device may include multiple processing elements or processors and multiple types of processing elements or processors. For example, a hardware device may include multiple processors or a processor and a controller. In addition, other processing configurations are possible, such as parallel processors.

The computer programs include processor-executable instructions that are stored on at least one non-transitory computer-readable medium (memory). The computer programs may also include or rely on stored data. The computer programs may encompass a basic input/output system (BIOS) that interacts with hardware of the special purpose computer, device drivers that interact with particular devices of the special purpose computer, one or more operating systems, user applications, background services, background applications, etc. As such, the one or more processors may be configured to execute the processor executable instructions.

The computer programs may include: (i) descriptive text to be parsed, such as HTML (hypertext markup language) or XML (extensible markup language), (ii) assembly code, (iii) object code generated from source code by a compiler, (iv) source code for execution by an interpreter, (v) source code for compilation and execution by a just-in-time compiler, etc. As examples only, source code may be written using syntax from languages including C, C++, C#, Objective-C, Haskell, Go, SQL, R, Lisp, Java®, Fortran, Perl, Pascal, Curl, OCaml, Javascript®, HTML5, Ada, ASP (active server pages), PHP, Scala, Eiffel, Smalltalk, Erlang, Ruby, Flash®, Visual Basic®, Lua, and Python®.

Further, at least one embodiment of the invention relates to the non-transitory computer-readable storage medium including electronically readable control information (processor executable instructions) stored thereon, configured in such that when the storage medium is used in a controller of a device, at least one embodiment of the method may be carried out.

The computer readable medium or storage medium may be a built-in medium installed inside a computer device main body or a removable medium arranged so that it can be separated from the computer device main body. The term computer-readable medium, as used herein, does not encompass transitory electrical or electromagnetic signals propagating through a medium (such as on a carrier wave); the term computer-readable medium is therefore considered tangible and non-transitory. Non-limiting examples of the non-transitory computer-readable medium include, but are not limited to, rewriteable non-volatile memory devices (including, for example flash memory devices, erasable programmable read-only memory devices, or a mask read-only memory devices); volatile memory devices (including, for example static random access memory devices or a dynamic random access memory devices); magnetic storage media (including, for example an analog or digital magnetic tape or a hard disk drive); and optical storage media (including, for example a CD, a DVD, or a Blu-ray Disc). Examples of the media with a built-in rewriteable non-volatile memory, include but are not limited to memory cards; and media with a built-in ROM, including but not limited to ROM cassettes; etc. Furthermore, various information regarding stored images, for example, property information, may be stored in any other form, or it may be provided in other ways.

The term code, as used above, may include software, firmware, and/or microcode, and may refer to programs, routines, functions, classes, data structures, and/or objects. Shared processor hardware encompasses a single microprocessor that executes some or all code from multiple modules. Group processor hardware encompasses a microprocessor that, in combination with additional microprocessors, executes some or all code from one or more modules. References to multiple microprocessors encompass multiple microprocessors on discrete dies, multiple microprocessors on a single die, multiple cores of a single microprocessor, multiple threads of a single microprocessor, or a combination of the above.

Shared memory hardware encompasses a single memory device that stores some or all code from multiple modules. Group memory hardware encompasses a memory device that, in combination with other memory devices, stores some or all code from one or more modules.

The term memory hardware is a subset of the term computer-readable medium. The term computer-readable medium, as used herein, does not encompass transitory electrical or electromagnetic signals propagating through a medium (such as on a carrier wave); the term computer-readable medium is therefore considered tangible and non-transitory. Non-limiting examples of the non-transitory computer-readable medium include, but are not limited to, rewriteable non-volatile memory devices (including, for example flash memory devices, erasable programmable read-only memory devices, or a mask read-only memory devices); volatile memory devices (including, for example static random access memory devices or a dynamic random access memory devices); magnetic storage media (including, for example an analog or digital magnetic tape or a hard disk drive); and optical storage media (including, for example a CD, a DVD, or a Blu-ray Disc). Examples of the media with a built-in rewriteable non-volatile memory, include but are not limited to memory cards; and media with a built-in ROM, including but not limited to ROM cassettes; etc. Furthermore, various information regarding stored images, for example, property information, may be stored in any other form, or it may be provided in other ways.

The apparatuses and methods described in this application may be partially or fully implemented by a special purpose computer created by configuring a general purpose computer to execute one or more particular functions embodied in computer programs. The functional blocks and flowchart elements described above serve as software specifications, which can be translated into the computer programs by the routine work of a skilled technician or programmer.

Although described with reference to specific examples and drawings, modifications, additions and substitutions of example embodiments may be variously made according to the description by those of ordinary skill in the art. For example, the described techniques may be performed in an order different with that of the methods described, and/or components such as the described system, architecture, devices, circuit, and the like, may be connected or combined to be different from the above-described methods, or results may be appropriately achieved by other components or equivalents.

According to an embodiment of the invention, a computer-implemented method is provided for at least partially suppressing an electric and/or magnetic field emitted by a magnetic resonance device during an examination. The method comprises a plurality of steps. A first step aims to measure a signature of the emitted electric and/or magnetic field using a sensor facility. A further step aims to provide a reference field profile, which reference field profile describes an electric and/or magnetic reference field for the magnetic resonance device. A further step aims to adapt the reference field profile to the measured signature. In addition, a step aims to suppress the emitted electric and/or magnetic field based upon the adapted reference field profile.

In other words, in an embodiment, a method is provided for active compensation of the electric and/or magnetic field emitted by a magnetic resonance device during an examination. The examination may comprise in particular a medical imaging procedure for visualizing one or more imaging regions in a volume of interest of an object under examination. This can be done by bringing the object under examination into an acquisition region of the magnetic resonance device. For example, the object under examination may be in the form of an anatomical body having one or more cavities. In particular, the object under examination may be a patient.

The magnetic resonance device may comprise in particular a field magnet or main magnet, which produces the static external magnetic field for aligning nuclear spins of the object under examination or of the patient in an acquisition region. The magnetic resonance device may also comprise gradient coils, which are designed to superimpose variable magnetic fields in three spatial directions on the static magnetic field for the purpose of spatially distinguishing the acquired imaging regions in a volume of interest of the object under examination. The magnetic resonance device may also comprise a body coil (BC for short), which is designed to radiate a radiofrequency signal into the volume of interest, and to receive resonance signals emitted by the object under examination. In addition, the magnetic resonance device can comprise a suppression apparatus having a transmit facility, which is designed in particular to produce a radiofrequency electric and/or magnetic opposing field, which opposing field is intended to compensate at least partially the radiofrequency signal emitted by the body coil outside the acquisition region.

The emitted electric and/or magnetic field can denote here in particular the electric and/or magnetic field emitted in total by the magnetic resonance device. The terms electric and/or magnetic field or electric and/or magnetic opposing field can denote in this context in particular electromagnetic fields and/or alternating electromagnetic fields in the frequency range of the magnetic resonance device. In particular, the emitted electric and/or magnetic field can refer to the alternating electric and/or magnetic radiofrequency field emitted by the magnetic resonance device. The alternating electric and/or magnetic radiofrequency field can have in particular contributions produced by the body coil and/or the suppression apparatus.

The signature of the emitted electromagnetic field can be measured in particular at a plurality of local sample points in particular by receiving one or more signals from the electric and/or magnetic field emitted by the magnetic resonance device. Receiving a signal can be understood to mean in particular capturing and providing for subsequent processing, an alternating electric and/or magnetic field in the frequency range of the magnetic resonance device. For example, the signature can be received by a sensor facility having one or more receivers or sensors, which can be in the form of receive antennas, for instance. The sensor facility is designed in particular such that the signals from the emitted electric and/or magnetic field can be captured at a plurality of different sample points in the room or in the surrounding area of the magnetic resonance device. For this purpose, the sensors of the sensor facility can be arranged at different positions in and/or on the magnetic resonance device. The sensor facility can output the signature as a wired electrical signal or as a digital, electrical, optical or even wireless signal, for example. In particular, the signature can have one or more local field variables. The field variables can comprise in particular the local field vectors of the emitted electric and/or magnetic field at the sample points. The field vectors can be given by local E-field and H-field vectors.

In other words, the signature measured in this way can thus be understood to be a relatively coarse sampling (or "fingerprint") of the instantaneously emitted electromagnetic field, but which in return can be produced rapidly and in real-time. If a signature of the emitted radiofrequency field is produced, both the body coil and the suppression apparatus, or its transmit facility, can make contributions thereto.

The measured signature can thus provide only a piece of information at the sample points. Therefore initially it does not provide a sufficient basis for assessing the emitted electric and/or magnetic field outside the sample points and subsequently for compensating or suppressing the field, for instance by way of an opposing field. To be able to make a statement from the locally measured signature about the emitted electric and/or magnetic field in the entire spatial region (or at least in the spatial region relevant to the shielding), it is provided according to the invention to compare the measured signature with a reference field profile known in advance, and to "map" the reference field profile onto the measured signature.

The reference field profile is preferably already produced in advance of an actual examination, and describes at a higher spatial sampling rate than the measured signature a possible electric and/or magnetic (reference) field emitted by the magnetic resonance device. In particular, the reference field profile thus contains field variables, i.e. for instance E-field and H-field vectors, for spatial points outside the sample points of the signature. The reference field can be considered to be the electric and/or magnetic field of a reference examination or example examination. Like the signature, the reference field profile can relate to the emitted radiofrequency field. Again like the measured signature, the reference field profile can also contain contributions from the body coil and/or from the suppression apparatus (or its transmit facility). In particular, the reference field profile contains field variables for regions in which compensation or suppression of the electric and/or magnetic field emitted by the magnetic resonance device is meant to take place, i.e. for regions that are not covered spatially by the signature. In particular, the reference field profile has a higher spatial resolution or sampling rate of electric and/or magnetic field variables than the measured signature. The reference field profile characterizes in particular the electromagnetic (radiofrequency) field emitted by the magnetic resonance device for the reference or example examination, which in particular can have a certain degree of similarity to the performed examination.

In this context, "provide" can mean that the reference field profile is loaded from a database or is held in a database. The reference field profile in particular can have been created in advance of the examination. The reference field profile may thus be pre-configured. The reference field profile may have been produced empirically, for instance by measuring an example examination, at a high spatial sampling rate in advance of the actual examination (reference measurement). Moreover, the reference field profile may have been produced by simulating the emitted electromagnetic field for an example examination. Furthermore, the reference field profile may have been produced by a combination of a reference measurement and a simulation (based thereon).

The reference field profile thus describes the emission behavior of the magnetic resonance device more completely and at a higher resolution than the signature. Unlike the measured signature, however, the reference field profile does not represent the electric and/or magnetic field actually emitted at that instant, but "just" the field of a reference examination or example examination. Depending on the circumstances of the instantaneous examination, however, divergences from the reference or example examination can arise, which can result in a modified electric and/or magnetic field. For instance different dimensions of the patient can lead to morphological deformations of the electric and/or magnetic field, just as can differently placed attachments or cable runs. In order to capture these effects, it is provided to adapt the reference field profile to the measured signature. This can involve, for instance, deforming the reference field profile until the reference field profile "fits" the measured signature. In other words, the reference field profile is modified such that the spatially resolved field variables contained therein match as closely as possible the measured field variables of the signature. A suitable mapping or transformation can be found for this and applied to the reference field profile.

By adapting the reference field profile to the measured signature, an adapted reference field profile is then available that not only describes the emitted electric and/or magnetic field at the sample points of the signature but also is a good approximation for regions outside the sample points. The adapted reference field profile can hence be used as the calculation basis for suppressing the electric and/or magnetic emissions from the magnetic resonance device. In particular, it is possible to derive from the adapted reference field profile how an electric and/or magnetic opposing field must be constituted in order to compensate or suppress the adapted reference field profile, or the field variables described therein, in a defined spatial region.

This allows in particular radiofrequency emissions from the magnetic field apparatus to be actively suppressed outside the acquisition region, and makes it possible to operate the magnetic resonance device without providing a shielded room. Measuring the signature using only a few local sample points allows not only a sensor facility of relatively low complexity in close range of the magnetic resonance device, but also rapid detection of the relevant characteristic values. At the same time, the comparison with a pre-configured reference field of higher resolution ensures that it is nonetheless possible to make a statement about the long-range field behavior.

According to an embodiment, the suppression of the emitted electric and/or magnetic field takes place in a defined spatial region in relation to the magnetic resonance device.

This can ensure that the suppression of the emitted electric and/or magnetic field does not impair the actual examination. The defined spatial region differs in particular from the acquisition region. In addition, the defined spatial region may differ from a near region of the magnetic resonance device. In particular, the defined spatial region may be a far region of the magnetic resonance device, the far region being defined in particular as a spatial region beyond a specified distance from the volume of interest or from the magnetic resonance device. For example, the specified distance may be 4 to 12 meters and preferably 6-10 meters, and particularly preferably 8 meters. Hence the emitted electric and/or magnetic field is shielded in those spatial regions that lie at a distance from the magnetic resonance device and/or from the acquisition region that is greater than the specified distance. The near region can adjoin the acquisition region outwards from the magnetic resonance device. The far region can in turn adjoin the near region outwards from the magnetic resonance device.

According to an embodiment, the measurement of the signature takes place in a measurement spatial region, which differs from the defined spatial region in which the emitted electromagnetic field is meant to be suppressed.

In particular, the measurement spatial region can be defined as a near region in relation to the magnetic resonance device or the acquisition region. This near region may be defined, for example, as an approximately spherical space around the acquisition region or the magnetic resonance device and having as a radius the specified distance. This has the advantage that the sensor facility for measuring the signature needs to be arranged solely in the measurement spatial region, and in particular does not need a sophisticated sensor system in the far region of the magnetic resonance device.

According to an embodiment, the reference field profile describes the reference field at least in the defined spatial region and the measurement spatial region.

Thus in other words, the reference field profile forms the bridge between the local sample points of the emitted electric and/or magnetic field in the near region of the magnetic resonance device and those regions in which ultimately the emitted electric and/or magnetic field is meant to be suppressed.

According to an embodiment, the step of adapting comprises registering the reference field profile with the measured signature.

"Registration" is a procedure known primarily from image processing that involves bringing two or more images of the same scene, or at least similar scenes, into optimum alignment with each other. The individual images may differ from each other for instance because they were acquired at different times or using different imaging apparatuses. In the process, one image is defined as the reference image. A suitable mapping is calculated to bring the other images into optimum alignment with the reference image. The inventor of the present application has found that this technique can also be applied outside image processing to adapting electric and/or magnetic fields, and in particular to adapting the reference field profile to the measured signature. In other words, in this case the signature assumes the role of the reference image, to which the reference field profile is adapted. Instead of image data such as pixel values, in this case field variables (for instance the E-field and H-field vectors) can be compared with one another other and mapped onto one another. It has been found that accurate, and above all rapid, adaptation of the reference field profile to the measured signature can be achieved by using registration. This allows the electromagnetic field emitted by the magnetic resonance device to be shielded efficiently in real time.

Registration typically comprises establishing corresponding variables, calculating an equalizing transformation, which converts into the reference coordinate system the data to be adapted, and applying the transformation. Applied to electric and/or magnetic fields, this can mean that field variables corresponding to the field variables measured in the signature are first identified in the reference field profile. Then an equalizing transformation is calculated, which converts the corresponding field variables one into the other. This equalizing transformation can then be used to convert the entire reference field profile into the reference system of the measured signature. Applying the calculated transformation to the reference field profile then results in the adapted reference field profile, based upon which the electric and/or magnetic emissions from the magnetic resonance device can then be suppressed.

Registrations are often classified as rigid (or global) registrations and non-rigid (or deformable) registrations. In the case of global registrations, a transformation rule is applied uniformly to all the pixels, or in this context to all the field variables. Such transformations typically cover (global) rotations, translations, scalings or shear mappings, or in general affine transforms. Non-rigid or deformable transformations, on the other hand, take into account differences that differ locally in size.

If no local deformations or distortions of the fields occur, then even global registrations can provide acceptable results. The inventor has found, however, that local deformations play a part in the registration of electromagnetic field variables. For instance, a change in position of the patient can result in a local deformation of the electric and/or magnetic fields that can be mapped by global registration only with difficulty. According to an embodiment, a non-rigid or deformable registration is therefore employed, which can be used to represent local deformations. In particular, spline-based deformable registrations can be used, for instance thin-plate splines or B-splines, in which transformation functions are extrapolated by way of splines.

According to an embodiment, the calculation of the equalizing transformation (and hence the transforming per se) is performed based upon a model-based transformation rule. The registration can be performed here in particular iteratively by minimizing a model-dependent energy function. The model can have, for example, elastic and/or viscous-fluid and/or electrodynamic contributions. In particular, the model can be based on finite elements. According to an embodiment, the model is based on the Maxwell equations.

By using model-based registration, the variations in the electric and/or magnetic fields, which inevitably arise in practice, can be represented particularly realistically, helping to achieve a better-adapted reference field profile and hence effective suppression of the electric and/or magnetic (radiofrequency) emissions from the magnetic resonance device.

According to an embodiment, the step of providing comprises selecting the reference field profile from a plurality of selection reference field profiles based upon the signature and/or a piece of examination information relating to the examination.

The selection reference field profiles can have been be created in particular in advance of the examination, in other words pre-configured. In particular, the selection reference field profiles may be stored in a storage device from which the selection reference field profiles can be retrievable. The selection reference field profiles can characterize the electric and/or magnetic fields and, in particular, the electric and/or magnetic radiofrequency fields for different possible examination configurations, and thus settings and/or configurations of the magnetic resonance device and/or patient attributes.

According to the embodiment, a suitable reference field profile is selected from the selection reference field profiles that represents a suitable starting point for the subsequent adaptation to the measured signature. A suitable reference field profile may be characterized, for instance, in that it already approximately represents the measured signature and/or is based on similar underlying conditions regarding the examination performed by the magnetic resonance device. It can therefore be provided that the selection of a suitable reference field profile from the selection reference field profiles takes into account the measured signature and/or a piece of examination information. The examination information may comprise, in particular, information about which type of examination is planned for which object under examination using which settings of the magnetic resonance device (in particular using which set field strengths) based upon which configuration of the magnetic resonance device. In particular, the examination information can comprise information regarding the performed examination, the configuration of the magnetic resonance device and/or regarding the patient (age, gender, size, weight, etc.). The examination information can thus be considered to be basic information for the purpose of selecting a suitable reference field profile. For example, the examination information may be obtained directly from the magnetic resonance device and/or received from an information system. The information system may be in the form of a hospital information system (HIS) or radiology information system (RIS), for example, and in particular may contain an examination planning module.

Selecting a reference field profile from a plurality of available selection reference field profiles according to the measured signature and/or a piece of examination information can improve the starting point for adapting the reference field profile. This can improve the estimate of the electric and/or magnetic fields in those spatial regions in which active suppression is meant to take place.

According to an embodiment, the step of suppressing comprises producing an electric and/or magnetic opposing field, which is determined such that it compensates at least partially the adapted reference field profile.

For instance, a radiofrequency opposing field is produced if the radiofrequency components of the electric and/or magnetic emissions from the magnetic resonance device are meant to be suppressed. A transmit facility can be provided for this purpose. The transmit facility can have one or more transmitters, for instance in the form of transmit antennas. If there are a plurality of transmit antennas, they preferably surround the magnetic resonance device in different spatial directions. It is conceivable, for example, that the opposing field is emitted as a shielding signal via one or more transmit antennas of the transmit facility. It is also conceivable to set opposing-field parameters such as the field strength, phase and/or frequency response based upon the adjusted reference field profile. The opposing field is determined in this case such that the electric and/or magnetic field emitted by the magnetic resonance device is reduced in particular in a defined spatial region. For example, phase and amplitude of the opposing field can be set such that the emitted electric and/or magnetic field and the opposing field emitted via the transmit facility cancel each other out at least partially in the defined spatial region by destructive interference. It is conceivable to optimize the opposing-field parameters using model-calculations of the signal propagation based on the geometry of the magnetic resonance device, the arrangement of the transmit facility, the arrangement of the sensor facility and/or the examination information. In particular, it is also conceivable that the opposing-field parameters were determined at an earlier time and are retrieved from a memory. The defined spatial region may differ in particular from the measurement spatial region in which the signature is measured. In particular, the defined spatial region may be a far region of the magnetic resonance device.

According to a further embodiment of the present invention, a magnetic resonance device having a suppression apparatus is provided, which suppression apparatus is designed to at least partially suppress an electric and/or magnetic field emitted by the magnetic resonance device during an examination. The suppression apparatus has a computing facility, and also has a sensor facility and a transmit facility, which are each in signal communication with the computing facility. The sensor facility is designed to measure a signature of the electric and/or magnetic field emitted by the magnetic resonance device, while the transmit facility is designed to produce an electric and/or magnetic opposing field for the purpose of at least partially compensating the emitted electric and/or magnetic field. The computing facility is designed to provide a reference field profile, which reference field profile describes an electric and/or magnetic reference field for the magnetic resonance device. The computing facility is also designed to adapt the reference field profile to the measured signature. The computing facility is moreover designed to control the transmit facility in such a way that the opposing field produced by the transmit facility compensates at least partially the adapted reference field profile.

The sensor facility and/or the transmit facility can be embodied as described above. In particular, the computing facility can be part of the controller of the magnetic resonance device. The computing facility can also be in the form of a local controller, which is separate from the controller of the magnetic resonance device. The computing facility can have one or more control devices and/or one or more processors.

Advantages of an embodiment of the proposed magnetic resonance device are essentially the same as the at least one of the advantages of an embodiment of the proposed method. Features, advantages or alternative embodiments can be applied likewise to the other claimed subject matter, and vice versa.

According to an embodiment, the suppression apparatus also has a memory facility, which is in signal communication with the computing facility, in which memory facility are stored a plurality of selection reference field profiles. The computing facility is also designed to provide the reference field profile by selecting from the selection reference field profiles based upon the signature and/or a piece of examination information relating to the examination.

The memory facility can be in the form of a central or local database. In particular, the memory facility can be part of the magnetic resonance device and/or of the suppression apparatus. For example, the memory facility can be in the form of a computer-readable data storage medium of the magnetic resonance device and/or of the suppression apparatus. In particular, the memory facility can be in the form of an SSD or HDD hard disk, which the computing facility can access. Alternatively, the memory facility may be part of a local server architecture or of a Cloud storage system.

In a further embodiment, the invention relates to a computer program product, which comprises a program and can be loaded directly into a memory of the programmable computing facility, and has program segments, e.g. libraries and auxiliary functions, in order to perform a method, in particular according to an embodiment, for at least partially suppressing an electric and/or magnetic field emitted by a magnetic resonance device during an examination, when the computer program product is executed.

The computer program product can comprise software containing a source code, which still needs to be compiled and linked or just needs to be interpreted, or an executable software code, which for execution only needs to be loaded into the computing facility. The method can be performed quickly, reproducibly and robustly by the computer program product. The computer program product is configured such that it can perform the method steps according to an embodiment of the invention by way of the computing facility. Therefore, the computing facility must have the necessary specification such as, for example, a suitable RAM, a suitable graphics card or a suitable logic unit, in order to be able to perform the respective method steps efficiently.

The computer program product is stored, for example, on a computer-readable medium or in a network or server, from where it can be loaded into the processor of a computing facility, which processor may be connected directly to the computing facility or may form part of the computing facility. In addition, control data of the computer program product can be stored on an electronically readable data storage medium. The control data in the electronically readable data storage medium can be designed such that it performs a method according to the invention when the data storage medium is used in the computing facility. Examples of electronically readable data storage media are a DVD, a magnetic tape or a USB stick, on which is stored electronically readable control data, in particular software. When this control data is read from the data storage medium and stored in the computing facility, all the embodiments according to the invention of the above-described methods can be performed. Hence the invention can also proceed from the computer-readable medium and/or from the electronically readable data storage medium. The advantages of the proposed computer program product are essentially the same as the advantages of the proposed methods.

FIG. 1 shows a schematic diagram of an embodiment of a magnetic resonance device 1 having a suppression apparatus 70 according to the invention.

The magnet unit 10 comprises a field magnet 11, which produces a static magnetic field BO for aligning nuclear spins of samples or of the patient 100 in an acquisition region. The acquisition region is characterized by an extremely homogeneous static magnetic field BO, the homogeneity relating in particular to the magnetic field strength or magnitude. The acquisition region AB is approximately spherical and located in a patient tunnel 16, which extends through the magnet unit 10 in a longitudinal direction 2. Inside the acquisition region AB, one or more imaging regions, for instance, can be visualized in a volume of interest of the patient. A patient couch 30 can be moved inside the patient tunnel 16 by the travel unit 36. The field magnet 11 is usually a superconducting magnet, which can provide magnetic fields having a magnetic flux density of up to 3 T or even higher in the latest equipment. For lower field strengths, however, permanent magnets or electromagnets having normal-conducting coils can also be used.

The magnet unit 10 also has gradient coils 12, which are designed to superimpose variable magnetic fields in three spatial dimensions on the magnetic field BO for the purpose of spatial discrimination of the acquired imaging regions in the volume of interest. The gradient coils 12 are usually coils made of normal-conducting wires, which can generate mutually orthogonal fields in the volume of interest.

The magnet unit 10 also has a body coil 14, which is designed to radiate into the volume of interest a radiofrequency signal supplied via a signal line, and to receive resonance signals emitted by the patient 100 and to output the resonance signals via a signal line.

A control unit 20 supplies the magnet unit 10 with the various signals for the gradient coils 12 and the body coil 14, and analyses the received signals.

Thus the control unit 20 has a gradient controller 21, which is designed to supply the gradient coils 12 via supply lines with variable currents that provide, coordinated in time, the desired gradient fields in the volume of interest.

In addition, the control unit 20 comprises a radiofrequency unit 22, which is designed to produce a radiofrequency pulse having a defined waveform over time, amplitude and spectral power distribution for the purpose of exciting magnetic resonance of the nuclear spins in the patient 100. Pulse powers can reach in the region of kilowatts here. The excitation pulses can be emitted via the body coil 14 or via a local transmit antenna into the patient 100. A controller 23 communicates via a signal bus 25 with the gradient controller 21 and the radiofrequency unit 22.

Arranged as a first receive coil on the patient 100 is a local coil 50, which is connected via a connecting line 33 to the radiofrequency unit 22 and its receiver. It is also conceivable, however, for the body coil 14 to form part of a sensor facility within the meaning of the invention.

Figure 2:
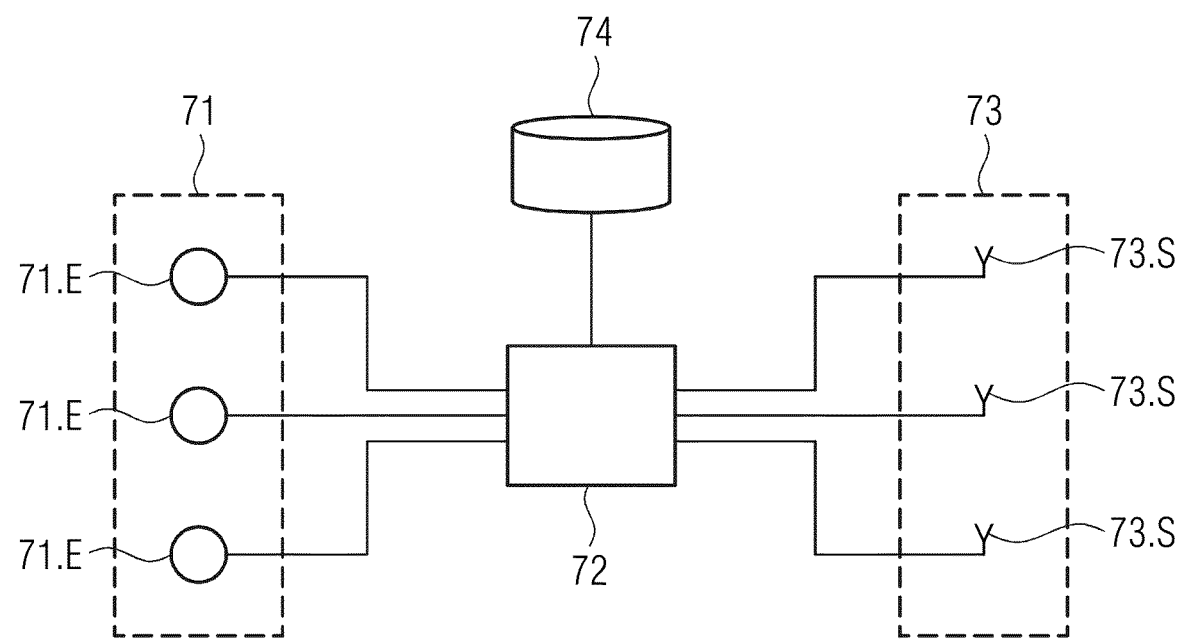
FIG. 2 shows schematically a possible embodiment of the suppression apparatus in detail.
Figure 3:
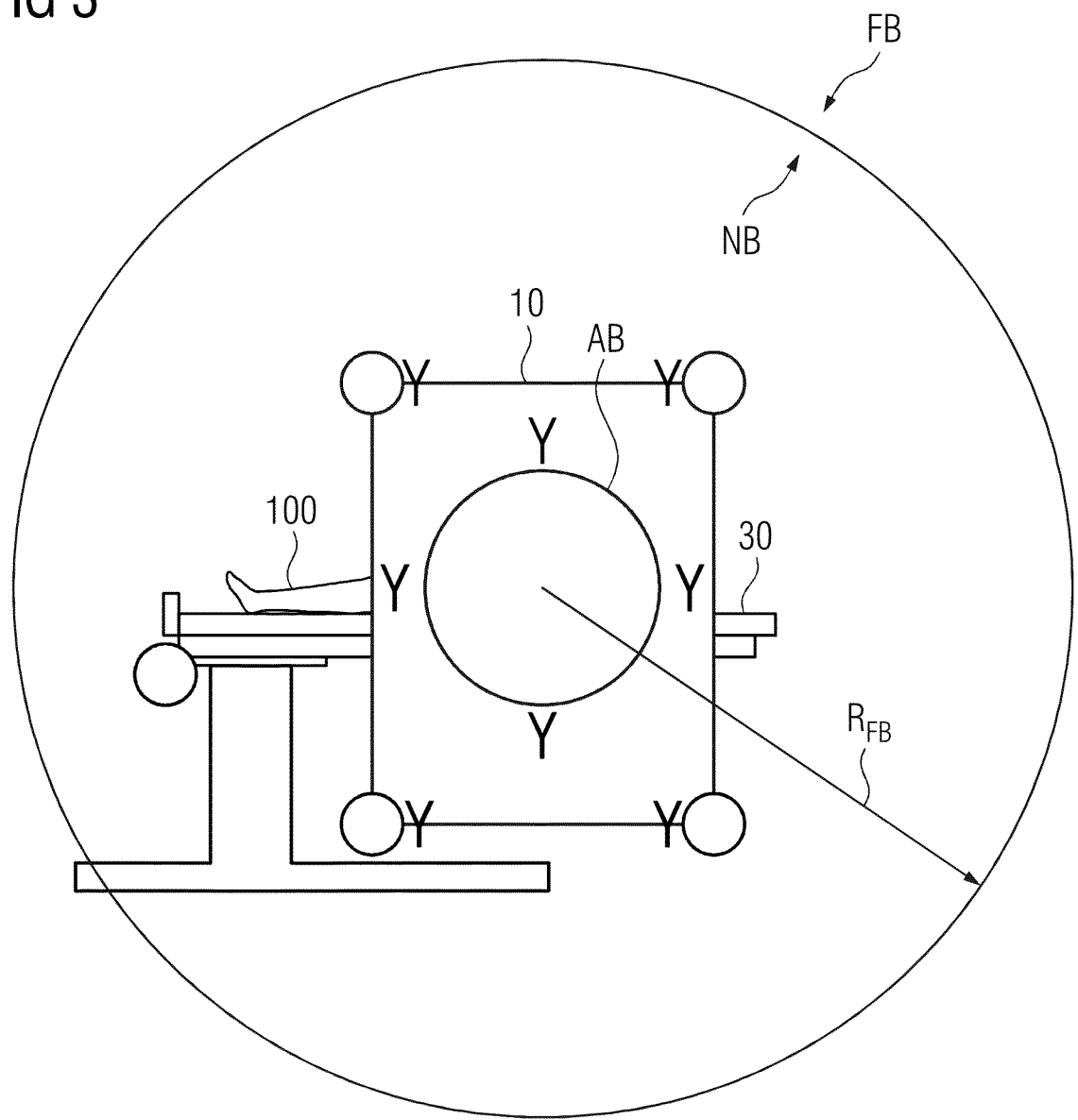
FIG. 3 shows schematically possible positions for arranging transmit and receive components of the suppression apparatus on the magnetic resonance device according to an embodiment.

FIG. 2 shows schematically a possible embodiment of the suppression apparatus 70 in detail. The suppression apparatus 70 shown has a sensor facility 71, a computing facility 72, a transmit facility 73 and a memory facility 74. FIG. 3 shows by way of example how the components of the suppression apparatus 70 may be arranged in relation to the magnetic resonance device 1. FIG. 3 shows three regions of the magnetic resonance device 1: the acquisition region AB, a near region NB, and a far region FB. The near region NB adjoins the acquisition region AB outwards from the magnetic resonance device 1. Alternatively, the acquisition region AB may also be defined as part of the near region NB. In other words, an arrangement of a component (e.g. the receiver 71.E or transmitter 73.S) in the near region AB does not exclude the possibility of this component being arranged in the acquisition region AB. The far region FB adjoins the outside of the near region AB. Thus the far region FB can also be considered to be a spatial region from which the near region NB is excluded. The boundary or bounding surface between near region NB and far region FB may be thought of, for instance, as a sphere of radius RFB about the magnetic resonance device 1/the acquisition region AB, which radius RFB may equal several meters in practice. It is obviously also conceivable, however, for the bounding surface to have other shapes, for instance elliptical or cylindrical or combinations thereof.

The computing facility 72 can be part of the device controller of the magnetic resonance device 1, i.e. of the control unit 20. Alternatively, the computing facility 72 may be in the form of a control unit, which is separate therefrom and is assigned exclusively to the suppression apparatus 70. The computing facility 72 may be in data communication with the control unit 20.

The memory facility 74 may have, for example, a computer-readable storage medium, for instance a mass storage device or hard disk, integrated in the suppression apparatus 70. Alternatively, the memory facility 74 may have a network memory, to which the computing facility 72 is connected via a network. For example, the network may be a local area network and/or wireless local area network. Stored in the memory facility 74 are a plurality of selection reference field profiles C-RFP, which in particular characterize as comprehensively as possible the alternating electric and/or magnetic field 1 of the magnetic resonance device 1 for specific cases (reference or example examinations). The specific cases may relate to specific examinations, configurations and settings of the magnetic resonance device 1. In other words, the selection reference field profiles C-RFP relate to reference fields of the magnetic resonance device 1. In this context "characterize" can mean than the selection reference field profiles C-RFP represent field variables of the reference fields in a comparatively high spatial resolution. This optionally takes into account both the emissions from the body coil 14 and the emissions from the transmit facility 73. In particular, the selection reference field profiles C-RFP describe the reference field both in the near region NB and in the far region NB (and, if applicable, also in the acquisition region AB). In other words, the selection reference field profiles C-RFP can contain as field variables the E-fields and H-fields, or field vectors, of the body coil 14 and of the transmit facility 73. The following notation is used for these below: EBC, HBC for the body coil, and Ei, Hi for the transmitters 73.S of the transmit facility 73, where i ranges from 1 to NA, and NA denotes the number of transmitters 73.S.

Figure 4:
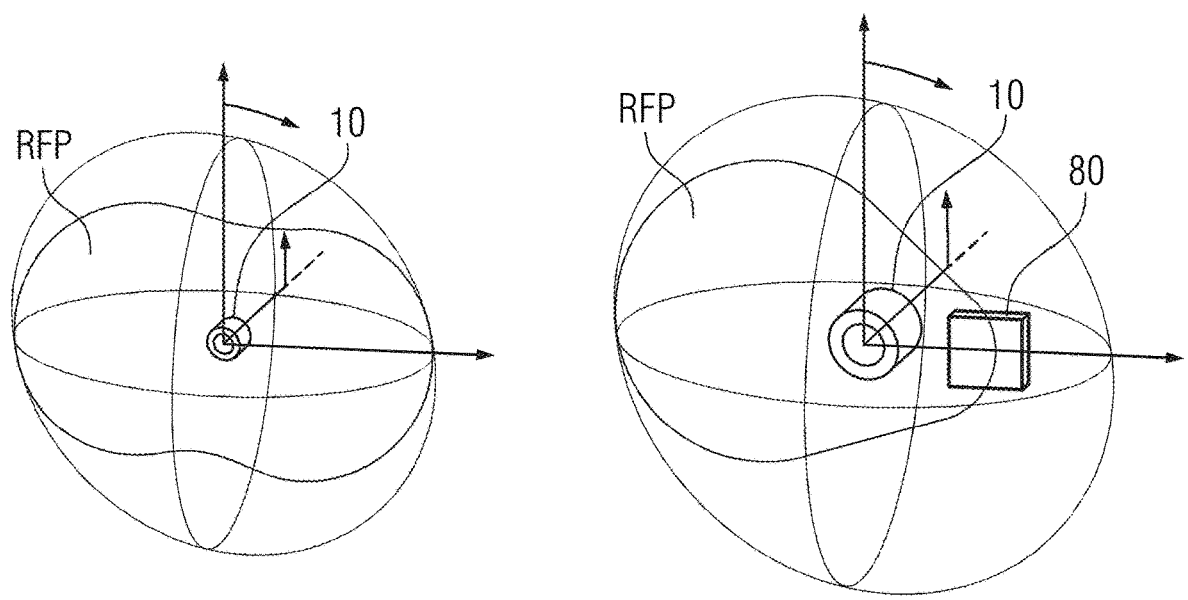
FIG. 4 shows schematically possible reference field profiles of the magnetic resonance device according to embodiments.

FIG. 4 shows examples of reference field profiles RFP. Shown on the left is a reference field profile RFP for an "empty" magnetic resonance device 1, while on the right is shown a field profile RFP for the case in which a patient is arranged in the patient tunnel 16 and in which additional components 80, such as switch boxes, that affect the electric and/or magnetic field, are located in the peripheral area. It is evident that the reference field profiles especially in the far region FB are affected significantly by the settings of the magnetic resonance device, by the examination carried out or by the type and number of additional devices and attachments for the magnetic resonance device 1. For example, if parts of a ventilator enter the acquisition region AB because the patient requires ventilation, this can have a considerable impact on the emitted electric and/or magnetic field and hence on the reference field profile RFP. The same applies to the type, number and arrangement of possible local coils or the configuration and power output of the transmit facility 73. Further influencing factors relate to the room in which the magnetic resonance device 1 is located and in which the examination takes place. The information relating to the settings or configuration of the magnetic resonance device 1, of the room in which the examination takes place, and to the type of the examination or to the attributes of the patient are referred to below also as "examination information" UI.

The reference field profiles RFP are generated in advance of the actual examination. The various reference field profiles RFP available for selection model a range of possible underlying conditions (examination information UI). For example, the reference field profiles RFP can be determined by simulating the electromagnetic emissions from the magnetic resonance device 1. Alternatively or additionally, it is conceivable to arrange the magnetic resonance device 1 in an EMC chamber and to use a spatially high-resolution measurement to characterize the field emissions.

FIG. 2 shows the sensor facility 71 as having three receivers 71.E by way of example. This shall not be seen as restrictive, however. In principle, any number of receivers 71.E is conceivable. In particular, just one receiver 71.E can be provided. Preferably, however, the sensor facility 71 has a plurality of receivers 71.E, as indicated in FIG. 3 for example. In this case, the receivers 71.E are preferably arranged at different positions in the near region NB of the magnetic resonance device 1. Similarly, the transmit facility 73 also preferably has a plurality of transmitters 73.S, as shown in FIG. 3 for example. The transmitters 73.S are likewise arranged preferably in the near region NB. Alternatively, however, the transmit facility 73 can also have only one transmitter 73.S.

The receivers 71.E of the sensor facility 71 can have antennas, which convert an alternating electric and/or magnetic radiofrequency field into a current and/or a voltage in a conductor. The antenna may be an induction loop, for example. The electrical signal produced in this way is amplified, for example, by a low noise preamplifier (LNA) back in the receiver 71.E, before being transferred via a signal connection to the computing facility 72 for further processing. Alternatively, the sensor facility 71 can have a digital signal processing resource, for instance a digital signal processor DSP or an FPGA. In this example embodiment, the sensor facility 71 already digitizes the interference signals and transfers these signals to the computing facility 72. The field variables provided to the computing facility 72 in this way are denoted below by $\tilde{E}_{BC}$, $\tilde{H}_{BC}$ for the body coil 14 and by $\tilde{E}_i$, $\tilde{H}_i$ for the transmitters 73.S.

The computing facility 72 is designed to combine the signals from the receivers 71.E of the receive unit 71 so as to generate a spatially resolved signature S of the alternating radiofrequency electric and/or magnetic field emitted by the magnetic resonance device 1. The signature S can comprise matrices of size NA+1×NE, one for the H-field and one for the E-field, where NE denotes the number of receivers 71.E. The signature S can thus be considered to be a type of fingerprint for the field emitted by the magnetic resonance device 1 at that instant. The signature S will thus depend on the instantaneous settings of the magnetic resonance device 1, the type of examination currently being performed (for instance expressed by the position of the patient and the attachments used on the magnetic resonance device 1), the room in which the examination is taking place, and the attributes of the patient (size, weight, gender, etc.). This information is also referred to below as the examination information UI.

The computing facility 72 is also designed to select from the selection reference field profiles C-RFP a reference field profile RFP, which if at all possible already has a certain similarity to the measured signature S. In order to simplify the selection, the computing facility 72 can be designed to draw on the signature S and/or the aforementioned examination information UI. For example, the latter can be provided to the computing facility 72 by the magnetic resonance device 1 or by an external information system (not shown).

The computing facility 72 is also designed to map the selected reference field profile RFP onto the measured signature S. As will be explained later in connection with FIGS. 5 and 6, the computing facility 72 can be designed in particular to establish a registration between the selected reference field profile RFP and the measured signature S, and hence to use an equalizing transformation to adapt the reference field profile RFP to the measured signature S. An adapted reference field profile A-RFP is thereby obtained, which describes the instantaneous electric and/or magnetic emissions from the magnetic resonance device 1 with a high spatial resolution in different spatial regions AB, NB, FB rather than at a few selected local measurement points, as is the case for the signature S.

The computing facility 72 is designed to control the transmit facility 73 based upon this adapted reference field profile A-RFP such that the instantaneously emitted electric and/or magnetic field (and here in particular the alternating radiofrequency field) is eliminated, or at least partially compensated, in defined spatial regions FB. For this purpose, the computing facility 72 can cause the transmit facility 73 to emit a suitable opposing field G via the transmitters 73.S. A suitable phase offset and weightings of the field components can be determined, for instance, based upon the adapted reference field profiles A-RFP, and mixed to form an opposing field G.

The transmitters 73.S of the transmit facility 73 can have, for example, antennas, in particular multi-part antennas or antenna arrays, which in particular can deploy directivity.

FIG. 3 shows schematically the arrangement of the transmitters 73.S and receivers 71.E in relation to the magnetic resonance device 1. With regard to the area surrounding the magnetic resonance device 1, as explained, it is possible in principle to distinguish between a near region NB and a far region FB. The magnet unit 10, like the acquisition region AB, is located in the near region NB. The electromagnetic emissions from the magnetic resonance device 1, however, radiate also into the far region FB, at least when there are no countermeasures. Although the electromagnetic emissions are meant to be suppressed in the far region FB, measuring the electromagnetic emissions in the far region FB is often not possible in practice, or only possible with great effort. The registration according to the invention of local measurements of the electromagnetic fields in the near region NB with pre-configured information about the emission behavior in the far region FB (in the form of the reference field profiles RFP) allows, however, the signature S measured in the near region NB to be extrapolated into the far region FB. As shown in FIG. 3, the receivers 71.E can therefore be arranged in the near region NB and in particular on the magnetic resonance device 1 or magnet unit 10 itself. The same applies to the transmitters 73.S. As shown in FIG. 3, the transmitters 73.S and the receivers 71.E are preferably arranged in different directions about the magnetic resonance device 1 in order to ensure optimum spatial coverage both when acquiring the signature S and when emitting the opposing field G. For example, the receivers 71.E and/or transmitters 73.S can be arranged at the "corners" of the magnet unit 10 or on the patient couch 30.

Figure 5:
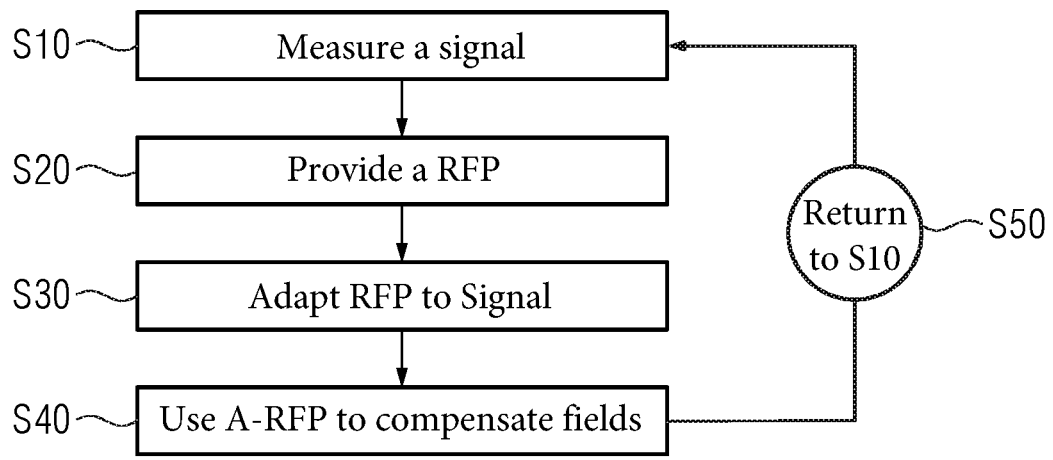
FIG. 5 is a schematic flow diagram of an example embodiment of the method according to the invention.
Figure 6:
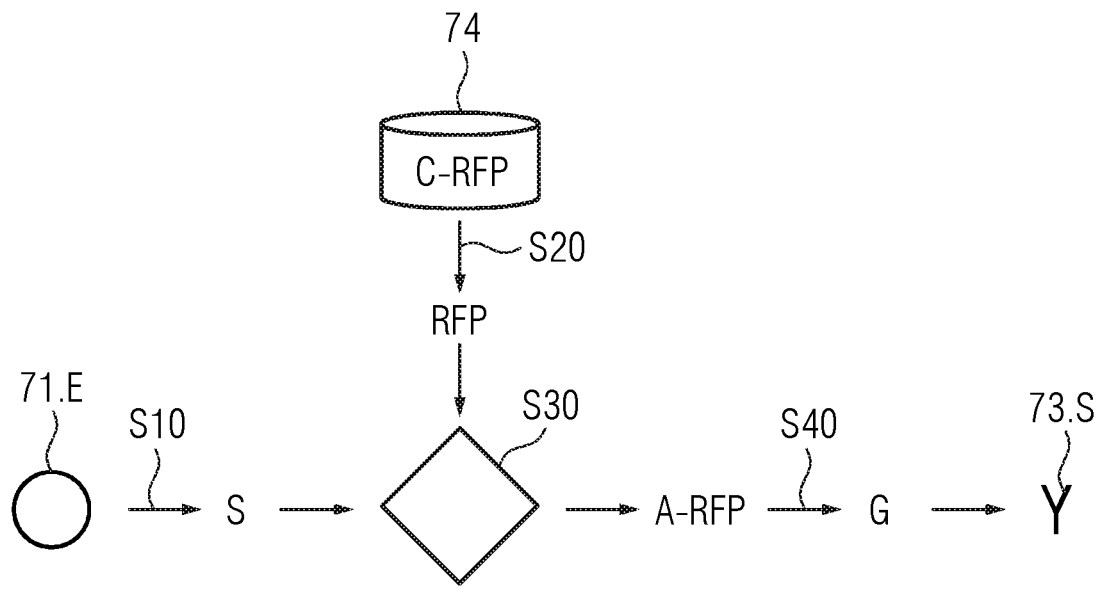
FIG. 6 is a schematic flow diagram illustrating the course of the data processing for an example embodiment of the method according to the invention.

FIG. 5 shows a schematic diagram of an embodiment of the proposed method for operating a medical imaging system 1. The order of the method steps is limited neither by the sequence shown nor by the chosen numbering. Thus the order of the steps can be interchanged if applicable, and individual steps can be omitted. FIG. 6 shows for the purpose of further clarification, a flow diagram for illustrating the course of the data processing for an example embodiment of the method according to the invention.

A first step S10 aims to measure a signature S of the alternating electric and/or magnetic field of the body coil 14 and/or of the transmit facility 73. The spatially distributed receivers 71.E of the sensor facility 71 perform the measurement in the near region NB. In this process, the H-fields and E-fields $\tilde{E}_{BC}$, $\tilde{H}_{BC}$ of the body coil 14 and the H-fields and E-fields $\tilde{E}_i$, $\tilde{H}_i$ of the transmitters 73.S can be detected (where i=1 to NA). The locations at which these field variables $\tilde{E}_{BC}$, $\tilde{H}_{BC}$, $\tilde{E}_i$, $\tilde{H}_i$ are detected are denoted below also as dNB.

In a subsequent step S20, a reference field profile RFP is provided. This can be done by selecting a suitable reference field profile RFP from the selection reference field profiles C-RFP. The selection can be based in particular on the signature S measured in step S10 or on the aforementioned examination information UI.

In a further step S30, the reference field profile RFP is adapted to the measured signature S. This can involve using in particular techniques from non-rigid (image) registration. In particular, the field variables $\tilde{E}_{BC}$, $\tilde{H}_{BC}$, $\tilde{E}_i$, $\tilde{H}_i$ of the signature S that are measured at the locations dNB can be identified with the corresponding field variables EBC, HBC, Ei, Hi at corresponding locations of the reference field profile RFP. This can be done, for example, by a simple comparison of the field variables. Alternatively, correlation algorithms can be used. In addition in step S30, an equalizing transformation F can be calculated for applying to the reference field profile RFP. The equalizing transformation F is determined here such that the difference between the field variables at the locations dNB is minimized.

The following holds for the E-field:

$$\operatorname*{argmin}_{X_E}\left(\sum_{j=BC,1\ldots NA}\|F\{X_E,E_j\}(d_{NB})-\tilde{E}_j\|\right),$$

and for the H-field:

$$\operatorname*{argmin}_{X_H}\left(\sum_{j=BC,1\ldots NA}\|F\{X_H,H_j\}(d_{NB})-\tilde{H}_j\|\right)$$

where $F\{X_H,H_j\}$, $F\{X_E,E_j\}$ is the transformation model function $F\{\ldots\}$, which adapts the reference field profile RFP to the measured signature using model parameters $X_{E,H}$ in order to produce thereby an adapted reference field profile A-RFP.

Typically transformation model functions from (image) registration can be used here, for instance what are known as thin-plate splines models, B-splines models, optical flow models, and others. In particular, finite element models based on the Maxwell equations can also be used. The same deformation field having the parameters $X_E$ apply here to the E-fields from the body coil 14 and from the transmit facility 73. This applies analogously to the deformation field of the H-fields (having corresponding parameters $X_H$). In other words, the deformation field can be understood to be the global divergence of the instantaneously emitted electric and/or magnetic field (represented by the measured signature S) from the "ideal state" of the reference field profile RFP that is nearest in similarity. The divergence may arise, for instance, by a change in the position in which the patient is arranged, by different patient characteristics such as size, weight, etc., or by an altered device configuration. Finally, after the optimization, an optimum set of deformation parameters $\hat{X}_E$, $\hat{X}_H$ is determined, which adapts the full reference field profile RFP optimally to the instantaneous situation represented by the signature S, i.e. to the field variables $\tilde{E}_{BC}$, $\tilde{H}_{BC}$, $\tilde{E}_i$, $\tilde{H}_i$ measured at the locations dNB in the near region NB.

In a further step S40, the adapted reference field profile A-RFP is used to at least partially compensate the emitted electric and/or magnetic fields primarily in the far region FB of the magnetic resonance device 1. This can be done in particular by determining an opposing field G, which can then be emitted by the transmit facility 73. For this purpose, the adapted reference field profile A-RFP is sampled at any locations dFB in the far region, and the corresponding field variables $\breve{E}_{BC,1\ldots NA}$, $\breve{H}_{BC,1\ldots NA}$ are extracted.

$$\breve{E}_{BC,1\ldots NA}=F\{\hat{X}_E,E_{BC,1\ldots NA}\}(d_{FB})$$

$$\breve{H}_{BC,1\ldots NA}=F\{\hat{X}_H,H_{BC,1\ldots NA}\}(d_{FB})$$

Suppression parameters w and v can be calculated on this basis in order to force the E-field and H-fields below specified limit values $E_{limit}$ and $H_{limit}$ in the far region FB by way of the opposing field G emitted by the transmit facility $$\operatorname*{argmin}_{w,v}\left(\begin{array}{l}\left|\breve{E}_{BC}+\sum_{i=1}^{NA}\breve{E}_iw_i\right|<E_{limit}\\ \left|\breve{H}_{BC}+\sum_{i=1}^{NA}\breve{H}_iv_i\right|<H_{limit}\end{array}\right)$$

where w and v shall be understood to be vectors. For example, the suppression parameters w and v may be gains or attenuations that can be applied to the adapted reference field profile A-RFP so as to provide the opposing field G.

A phase offset is also preferably provided. The suppression parameters w and v can also each depend on the frequency, i.e. have a spectral dependency. The suppression parameters w and v can be determined in various ways. For instance, the suppression parameters w and v can be determined analytically or by simulation. The suppression parameters w and v can also be stored for known configurations in the computing facility 72, and taken from the memory for the determination. In addition, adaptive methods are also conceivable, for instance as an optimization problem, in which the suppression parameters w and v are used to minimize an energy of the emitted electric and/or magnetic field in the far region FB. Once the opposing field G has been determined sufficiently, it can be emitted by the transmit facility 73.

The optional step S50 is embodied finally as a repetition step. After step S40, step S50 leads back to step S10, whereby it is possible to achieve constant checking and suppression of the long-range emissions from the magnetic resonance device 1. The repetition may be a continuous repetition that runs through steps S10 to S40 in defined time cycles. Alternatively, an adaptive repetition of steps S10 to S40 can also be implemented, in which the suppression apparatus 70 is updated only when significant changes have happened in the examination. Such changes may originate, for instance, from an altered position of the patient or modified settings at the magnetic resonance device 1. The suppression apparatus 70 can be designed for this purpose, for example, to monitor the measured signature S continuously and to make a change to the adapted reference field profile A-RFP only when differences in the measured signature S that lie above a threshold value arise between individual measurement cycles. In order to change the adapted reference field profile A-RFP, another reference field profile RFP can be selected, for example, in step S20, and/or the adaptation in step S30 can be optimized. If a change to the adapted reference field profile A-RFP is not necessary, steps S20 and S30 can be skipped and step S40 can be executed based upon the existing adapted reference field profile A-RFP and thus using the existing suppression parameters w and v.

Even if not explicitly stated, individual example embodiments, or individual sub-aspects or features of these example embodiments, can be combined with, or substituted for, one other, if this is practical and within the meaning of the invention, without departing from the present invention. Without being stated explicitly, advantages of the invention that are described with reference to one example embodiment also apply to other example embodiments, where transferable.

Of course, the embodiments of the method according to the invention and the imaging apparatus according to the invention described here should be understood as being example. Therefore, individual embodiments may be expanded by features of other embodiments. In particular, the sequence of the method steps of the method according to the invention should be understood as being example. The individual steps can also be performed in a different order or overlap partially or completely in terms of time.

The patent claims of the application are formulation proposals without prejudice for obtaining more extensive patent protection. The applicant reserves the right to claim even further combinations of features previously disclosed only in the description and/or drawings.

References back that are used in dependent claims indicate the further embodiment of the subject matter of the main claim by way of the features of the respective dependent claim; they should not be understood as dispensing with obtaining independent protection of the subject matter for the combinations of features in the referred-back dependent claims. Furthermore, with regard to interpreting the claims, where a feature is concretized in more specific detail in a subordinate claim, it should be assumed that such a restriction is not present in the respective preceding claims.

Since the subject matter of the dependent claims in relation to the prior art on the priority date may form separate and independent inventions, the applicant reserves the right to make them the subject matter of independent claims or divisional declarations. They may furthermore also contain independent inventions which have a configuration that is independent of the subject matters of the preceding dependent claims.

None of the elements recited in the claims are intended to be a means-plus-function element within the meaning of 35 U.S.C. § 112(f) unless an element is expressly recited using the phrase "means for" or, in the case of a method claim, using the phrases "operation for" or "step for."

Example embodiments being thus described, it will be obvious that the same may be varied in many ways. Such variations are not to be regarded as a departure from the spirit and scope of the present invention, and all such modifications as would be obvious to one skilled in the art are intended to be included within the scope of the following claims.

What is claimed is:

1. A computer-implemented method for at least partially suppressing at least one of an emitted electric field or an emitted magnetic field, emitted by a magnetic resonance device during an examination, the computer-implemented method comprising:
   measuring a signature of at least one of the emitted electric field or the emitted magnetic field using a sensor facility;
   providing a reference field profile by loading the reference field profile from a database, the reference field profile describing at least one of an electric reference field or a magnetic reference field for the magnetic resonance device;
   adapting the reference field profile to the signature, to produce an adapted reference field profile; and
   suppressing the at least one of the emitted electric field or the emitted magnetic field based on the adapted reference field profile.

2. The computer-implemented method of claim 1, wherein the adapting comprises:
   registering the reference field profile with the signature.

3. The computer-implemented method of claim 1, wherein the adapting comprises:
   transforming the reference field profile with an equalizing transformation to produce the adapted reference field profile.

4. The computer-implemented method of claim 3, wherein
   the transforming is performed based on a model-based transformation rule.

5. The computer-implemented method of claim 1, wherein the suppressing comprises:
   producing at least one of an electric opposing field or a magnetic opposing field, to compensate, at least partially, for the adapted reference field profile.

6. The computer-implemented method of claim 1, wherein the providing comprises:
   selecting the reference field profile, from a plurality of selection reference field profiles, based on at least one of the signature or a piece of examination information relating to the examination.

7. The computer-implemented method of claim 1, wherein the reference field profile has a higher spatial sampling rate of the reference field than a spatial sampling rate of the at least one of the emitted electric field or the emitted magnetic field by the signature.

8. The computer-implemented method of claim 1, wherein the suppressing of the at least one of the emitted electric field or the emitted magnetic field takes place in a defined spatial region about the magnetic resonance device.

9. The computer-implemented method of claim 8, wherein
   the measuring of the signature in relation to the magnetic resonance device takes place in a measurement spatial region, the measurement spatial region differing from the defined spatial region.

10. The computer-implemented method of claim 9, wherein
the measurement spatial region corresponds to a region closer to the magnetic resonance device than the defined spatial region.

11. The computer-implemented method of claim 9, wherein
the reference field profile describes the reference field at least in the defined spatial region and the measurement spatial region.

12. The computer-implemented method of claim 2, wherein the registering is performed based on a non-rigid registration.

13. The computer-implemented method of claim 2, wherein the adapting comprises:
transforming the reference field profile with an equalizing transformation to produce the adapted reference field profile.

14. The computer-implemented method of claim 13, wherein
the transforming is performed based on a model-based transformation rule.

15. The computer-implemented method of claim 2, wherein the suppressing comprises:
producing at least one of an electric opposing field or a magnetic opposing field, to compensate, at least partially, for the adapted reference field profile.

16. The computer-implemented method of claim 2, wherein the providing comprises:
selecting the reference field profile, from a plurality of selection reference field profiles, based on at least one of the signature or a piece of examination information relating to the examination.

17. The computer-implemented method of claim 2, wherein the reference field profile has a higher spatial sampling rate of the reference field than a spatial sampling rate of the at least one of the emitted electric field or the emitted magnetic field by the signature.

18. The computer-implemented method of claim 8, wherein the defined spatial region differs from an acquisition region of the magnetic resonance device.

19. The computer-implemented method of claim 10, wherein
the reference field profile describes the reference field at least in the defined spatial region and the measurement spatial region.

20. A non-transitory computer program product, storing a program loadable into a memory of a programmable computing facility, the program including program segments to perform the method of claim 1 when the program is executed in the programmable computing facility.

21. A non-transitory computer-readable storage medium, storing program segments, readable and executable by a computing facility to perform the method of claim 1 when the program segments are executed by the computing facility.

22. A magnetic resonance device, comprising:
a suppression apparatus, configured to at least partially suppress at least one of an electric field or a magnetic field emitted by a magnetic resonance device during an examination, the suppression apparatus including
a computing facility,
a sensor facility, and
a transmit facility, each of the sensor facility and the transmit facility being in signal communication with the computing facility,
the sensor facility being configured to measure a signature of at least one of the electric field or the magnetic field emitted by the magnetic resonance device,
the transmit facility being configured to produce at least one of an electric opposing field or a magnetic opposing field, and
the computing facility being configured to
provide a reference field profile, the reference field profile describing at least one of an electric reference field or a magnetic reference field for the magnetic resonance device,
adapt the reference field-profile to the signature, to produce an adapted reference field profile, and
control the transmit facility to use the at least one of an electric opposing field or a magnetic opposing field produced by the transmit facility to compensate, at least partially, for the adapted reference field profile.

23. The magnetic resonance device of claim 22, wherein
the suppression apparatus includes a memory facility, in signal communication with the computing facility, the memory facility being configured to store a plurality of selection reference field profiles; and
the computing facility is configured to select the reference field profile, from the plurality of selection reference field profiles, based upon at least one of the signature or a piece of examination information relating to the examination.

* * * * *